(12) United States Patent
Lang et al.

(10) Patent No.: US 8,878,597 B2
(45) Date of Patent: Nov. 4, 2014

(54) CIRCUIT FOR CANCELING ERRORS CAUSED BY PARASITIC AND DEVICE-INTRINSIC RESISTANCES IN TEMPERATURE DEPENDENT INTEGRATED CIRCUITS

(71) Applicant: Robert Bosch GmbH, Stuttgart (DE)

(72) Inventors: Christoph Lang, Cupertino, CA (US); Crist Lu, Freemont, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/768,966

(22) Filed: Feb. 15, 2013

(65) Prior Publication Data
US 2014/0232450 A1 Aug. 21, 2014

(51) Int. Cl.
*H01L 37/00* (2006.01)
*H03K 17/14* (2006.01)

(52) U.S. Cl.
CPC ............................ *H03K 17/14* (2013.01)
USPC ......................... 327/512; 327/371; 374/178

(58) Field of Classification Search
CPC ....................... G01K 7/01; G01K 7/015
USPC ........ 327/371, 378, 512, 513; 374/172, 178
See application file for complete search history.

(56) References Cited

U.S. PATENT DOCUMENTS

| | | | |
|---|---|---|---|
| 3,617,859 A | 11/1971 | Dobkin et al. | |
| RE30,586 E | 4/1981 | Brokaw | |
| 5,195,827 A | 3/1993 | Audy et al. | |
| 6,008,685 A * | 12/1999 | Kunst | 327/512 |
| 6,554,469 B1 | 4/2003 | Thomson et al. | |
| 6,554,470 B2 * | 4/2003 | Zhang et al. | 374/178 |
| 6,808,307 B1 * | 10/2004 | Aslan et al. | 374/178 |
| 6,870,357 B1 * | 3/2005 | Falik | 324/71.5 |
| 7,010,440 B1 * | 3/2006 | Lillis et al. | 702/65 |
| 7,083,328 B2 * | 8/2006 | Johnson | 374/178 |
| 7,170,275 B1 | 1/2007 | Falik | |
| 7,281,846 B2 | 10/2007 | McLeod | |
| 7,461,974 B1 | 12/2008 | Aslan et al. | |
| 7,524,109 B2 * | 4/2009 | Gardner et al. | 374/178 |
| 7,598,722 B1 * | 10/2009 | Falik | 324/71.5 |
| 7,758,240 B2 * | 7/2010 | J lio et al. | 374/178 |
| 8,044,702 B2 * | 10/2011 | Niederberger | 327/513 |
| 8,696,199 B2 * | 4/2014 | St. Pierre et al. | 374/178 |
| 2006/0203883 A1 * | 9/2006 | Griffin | 374/178 |

* cited by examiner

*Primary Examiner* — William Hernandez
(74) *Attorney, Agent, or Firm* — Maginot Moore & Beck LLP

(57) ABSTRACT

In one embodiment, a circuit includes at least one transistor with a base and collector being electrically connected to a ground, and at least one current source being configured to apply four different currents (A, B, C, and D) to the emitter. A sum of the currents A and C are substantially equivalent to a sum of the currents B and D, or a sum of the currents A and D are substantially equivalent to a sum of the currents B and C. The circuit outputs first, second, third, and fourth voltage potentials between the emitter and the base during application of the currents A, B, C, and D, respectively.

14 Claims, 4 Drawing Sheets

CIRCUIT FOR CANCELING ERRORS CAUSED BY PARASITIC AND DEVICE-INTRINSIC RESISTANCES IN TEMPERATURE DEPENDENT INTEGRATED CIRCUITS

TECHNICAL FIELD

This disclosure relates generally to integrated circuits, and, more particularly, to integrated circuits that produce output signals having a dependence upon temperature.

BACKGROUND

Modern integrated circuits components often require a temperature sensor. A common way to measure the temperature in integrated circuits is to make use of the temperature dependence of the voltage drop across diodes. Often, a base-emitter diode is formed from a bipolar transistor for use in the temperature sensor.

FIG. 1 depicts a schematic diagram of a prior art temperature sensor circuit. In FIG. 1, a unity current I flows through the transistor T2 on the right side of the circuit, while a current of A times the unity current flows through the transistor T1 on the left side of the circuit. The base-emitter voltage of T1 differs from the base-emitter voltage of T2. The difference between both voltages is referred to as $\Delta V_{BE}$. $\Delta V_{BE}$ is expressed by:

$$\Delta V_{BE} = \frac{kT}{q} \cdot \ln(A) \quad \text{(Equation 1)}$$

where k is the Boltzmann constant ($1.38 \cdot 10^{-23}$ J/K), T is the absolute temperature, and q is the elementary charge of an electron ($1.6 \cdot 10^{-19}$ As).

Since the voltage $\Delta V_{BE}$ is proportional to absolute temperature, $\Delta V_{BE}$ is well suited for use in measuring the temperature of the sensor. Consequently, temperature of the sensor can be determined by solving equation 1 for T resulting in:

$$T = \frac{q \cdot \Delta V_{BE}}{k \cdot \ln(A)} \quad \text{(Equation 2)}$$

The circuit depicted in FIG. 1 would provide accurate temperature measurements using ideal transistors having base resistance values R_B and emitter resistance values R_E of zero ohms. In actual bipolar transistors, however, the structure of the transistor includes an inherent and non-zero base resistance R_B and emitter resistance R_E. The resistance of the base is of particular concern with a typical value for R_B of approximately 10Ω to 3000Ω. The value of R_B changes, however, as corresponding temperature of the transistor changes. The temperature dependent value of the base resistance is expressed as $R_B(T)$. The inclusion of the base resistance produces a more complex equation expressed as:

$$\Delta V_{BE} = \frac{kT}{q} \cdot \ln(A) + R_B(T) \cdot A \cdot \frac{I_c}{\beta(T)} - R_B(T) \cdot \frac{I_c}{\beta(T)} \quad \text{(Equation 3)}$$

where $I_c$ is the unity current and $\beta(T)$ is the temperature-dependent current gain β of the transistor. Thus, the base resistance introduces multiple temperature dependent factors that affect the value of $\Delta V_{BE}$. In existing temperature sensors, the inherent base resistance produces an error of approximately ±0.5° C. in the output of the temperature sensor.

What is needed, therefore, is a circuit that reduces or eliminates the errors introduced by intrinsic resistances in the transistors in various applications including temperature sensing, reference voltage generation, and reference current generation.

SUMMARY

Embodiments of the disclosure relates to system and method for canceling errors caused by parasitic and device-intrinsic resistances. The system includes at least one parasitic resistance system, and at least one current source being configured to apply four different currents (A, B, C, and D) to the circuit device. The parasitic resistance system in one embodiment is a diode, in another embodiment, it is a transistor, and in another embodiment, it is another desired parasitic resistance device. The diode can also be created by using a transistor with a base, a collector, and an emitter with the base and the collector being electrically connected. In one embodiment, the transistors can be NPN-bipolar transistors, PNP-bipolar transistors, or CMOS-transistors used in bipolar mode. The PNP-bipolar transistor is configured in one embodiment as described below. The at least one current source is configured to produce the four different currents with either a sum of the current A and the current C being substantially equivalent to a sum of the current B and the current D, or a sum of the current A and the current D being substantially equivalent to a sum of the current B and the current C. The circuit is configured to output a first voltage potential between the emitter of the at least one transistor and the base during application of the current A to the emitter of the at least one transistor, a second voltage potential between the emitter of the at least one transistor and the base during application of the current B to the emitter of the at least one transistor, a third voltage potential between the emitter of the at least one transistor and the base during application of the current C to the emitter of the at least one transistor, and a fourth voltage potential between the emitter of the at least one transistor and the base during application of the current D to the emitter of the at least one transistor.

In a further embodiment, a circuit includes a transistor set including at least one transistor with a base, a collector, and an emitter, and at least one current source configured to apply four different currents (A, B, C, and D) to at least one emitter of the transistor set to generate an emitter-base voltage potential, wherein either (i) a sum of the current A and the current C is substantially equivalent to a sum of the current B and the current D, or (ii) a sum of the current A and the current D is substantially equivalent to a sum of the current B and the current C. The circuit is configured to (i) generate a first emitter-base voltage potential during application of the current A, (ii) generate a second emitter-base voltage potential during application of the current B, (iii) generate a third emitter-base voltage potential during application of the current C, (iv) generate a fourth emitter-base voltage potential during application of the current D, and (v) generate an output associated with a temperature of the transistor set based upon the first emitter-base voltage potential, the second emitter-base voltage potential, the third emitter-base voltage potential, and the fourth emitter-base voltage potential.

DETAILED DESCRIPTION

For the purposes of promoting an understanding of the principles of the embodiments described herein, reference is now be made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Figure 1:
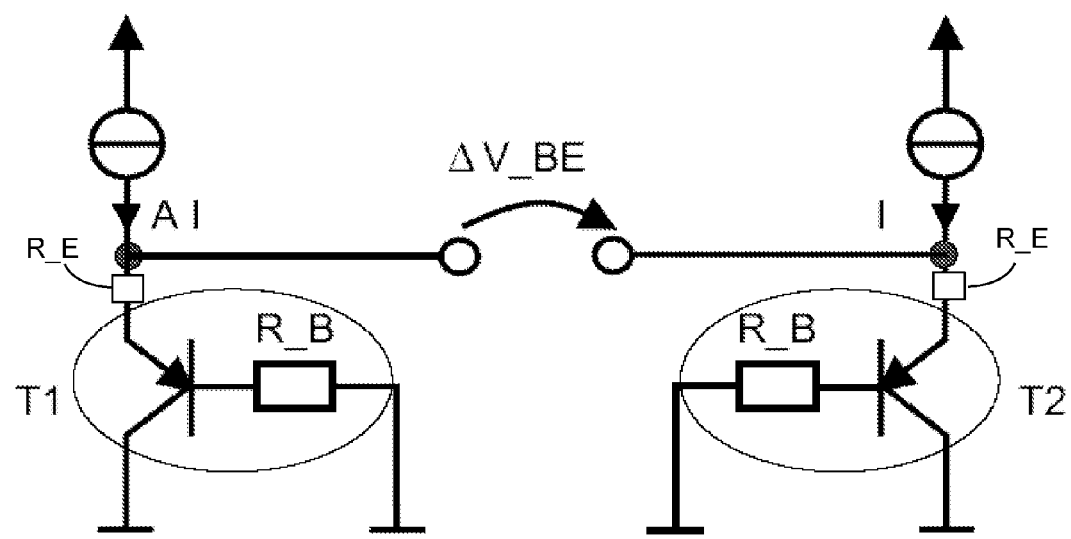
FIG. 1 is a schematic diagram of a prior art temperature sensor circuit including base resistors that are inherent to transistors used in the temperature sensor.
Figure 2:
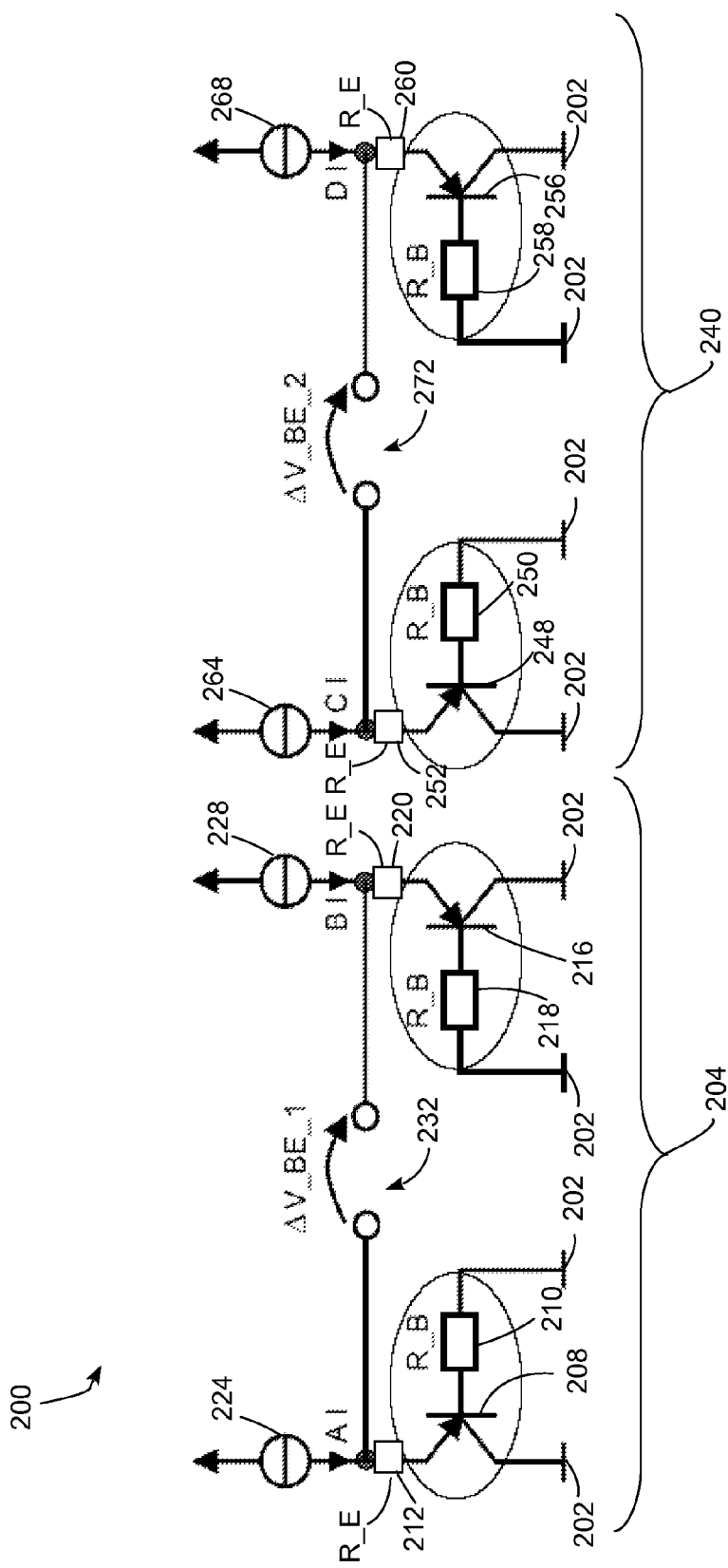
FIG. 2 is a schematic diagram of one embodiment of a temperature sensor circuit that reduces or eliminates errors introduced by the inherent base resistors in the transistors.

FIG. 2 depicts a temperature sensor circuit 200 including two sub-circuits 204 and 240. The sub-circuit 204 includes a circuit device, two devices 208 and 216 are illustrated, which have emitters that are electrically connected to current sources 224 and 228, respectively. The sub-circuit 240 includes a circuit device, two devices transistors 248 and 256 are also illustrated, which have emitters that are electrically connected to current sources 264 and 268, respectively. The four transistors 208, 216, 248, and 256 form a transistor set in the circuit 200. However, in other embodiments, the transistor set may include less than or more than four transistors depending on the application.

In FIG. 2, the circuit devices 208, 216, 248, and 256 in one embodiment are diodes, in another embodiment they are transistors, and in another embodiment they are another desired parasitic resistance devices. The transistors 208,216, 248, and 256 are PNP bipolar transistors, but alternative circuit configurations use NPN transistors. In some embodiments, the bipolar transistors 208 216, 248, and 256 are formed as complementary metal oxide semiconductor (CMOS) transistors that are operated in a bipolar mode as is known in the art. The circuits described herein are implemented as integrated circuits, as circuits formed from discrete components, or from a combination thereof.

In the circuit 200, each of the transistors in the sub-circuits 204 and 240 includes an inherent base resistance. In the circuit 200, the inherent base resistances are depicted as resistors 210, 218, 250, and 258 for the transistors 208, 216, 248, and 256, respectively. The base of each of the transistors 208, 216, 248, and 256 is connected in series with ground 202 through the corresponding base resistor.

Each of the transistors in the sub-circuits 204 and 240 also includes an inherent emitter resistance. In the circuit 200, the inherent emitter resistances are depicted as resistors 212, 220, 252,and 260 for the transistors 208, 216, 248, and 256, respectively. The emitter of each of the transistors 208, 216, 248, and 256 is connected to a corresponding one of the current sources 224, 228, 264, and 268 in series through the corresponding emitter resistor.

In the circuit 200, the current sources 224, 228, 264, and 268 are labeled as A, B, C, and D, respectively. Each current source is configured to produce a direct current (DC) current that flows through a corresponding one of the transistors during operation to produce a voltage potential between the emitter of each transistor and the ground 202. For example, the current source 224 produces a current A that enters the transistor 208 through the emitter and exits through the collector to reach the ground 202. The current also passes through the inherent emitter resistor 212 in the transistor 208, and a smaller amount of current passes through the base and base resistor 210 to reach the ground 202.

In the configuration of FIG. 2, each of the current sources 224, 228, 264, and 268 produces a different level of current, with the relative levels of current being selected to cancel the effects of the emitter and base resistor in each of the transistors to increase the accuracy of the temperature sensing circuit 200. In particular, the levels of the currents A, B, C, and D are selected to satisfy the equation such as:

$$A-B+C-D=0 \quad \text{(Equation 4)}$$

with the stipulation that none of the currents A→D are equal to one another.

One set of current multipliers that satisfies the requirements for the currents A→D in equation 4 is: A=5, B=1 (unity current), C=4, D=8. For example, when the current B is set at 1 μA, then the current A is 5 μA, the current C is 4 μA, and the current D is 8 μA. As described below, the selection of the relative current enables the outputs of the sub-circuits 204 and 240 to cancel the effects of the inherent emitter and base resistances in the transistors 208, 216, 248, and 256.

In the sub-circuit 204, the output 232 is labeled $\Delta V_{BE1}$ and represents a voltage differential between the voltage potential between the base and emitter of the transistor 208, and the voltage potential between the base and emitter of the transistor 216. Similarly, in the sub-circuit 240 the output 272 is labeled $\Delta V_{BE1}$ and represents a voltage differential between the voltage potential between the base and emitter of the transistor 248, and the voltage potential between the base and emitter of the transistor 256. A total $\Delta V_{BE}$ for the entire circuit 200 is expressed as follows:

$$\Delta V_{BE}=\Delta V_{BE1}+\Delta V_{BE2} \quad \text{(Equation 5)}$$

Substituting equation 3 for $\Delta V_{BE1}$ and $\Delta V_{BE2}$ yields the following equation:

$$\Delta V_{BE} = \frac{kT}{q} \cdot \ln\left(\frac{A}{B}\right) + \frac{kT}{q} \cdot \ln\left(\frac{C}{D}\right) + \frac{R_B(T)I_c}{\beta(T)} \cdot (A - B + C - D) \quad \text{(Equation 6)}$$

Recalling the relationship A−B+C−D=0 between the selected currents A→D from equation 3, the term including the temperature dependent base resistance $R_B(T)$ and the temperature dependent gain $\beta(T)$ is canceled, which results in the simplified version of equation 6 in the form of:

$$\Delta V_{BE} = \frac{kT}{q}\ln\left(\frac{A \cdot C}{B \cdot D}\right) \quad \text{(Equation 7)}$$

Similarly, the effect of the emitter resistances cancel out. Equation 7 can thus be solved for the temperature of the transistor resulting in:

$$T = \frac{q\Delta V_{BE}}{k\ln\frac{A \cdot C}{B \cdot D}} \quad \text{(Equation 8)}$$

Thus, the relationship of the current levels A→D as described above enables the temperature of the transistors in the circuit 200 to be identified without requiring additional information about the base and emitter resistances or β values of the transistors in the circuit 200.

In an alternative configuration, the total $\Delta V_{BE}$ for the circuit 200 is expressed as:

$$\Delta V'_{BE} = \Delta V_{BE1} - \Delta V_{BE2} \quad \text{(Equation 9)}$$

Thus, while the $\Delta V_{BE}$ term of equation 5 is the sum of $\Delta V_{BE1}$ and $\Delta V_{BE2}$, the $\Delta V'_{BE}$ term is the difference between $\Delta V_{BE1}$ and $\Delta V_{BE2}$. Substituting equation 3 for $\Delta V_{BE1}$ and $\Delta V_{BE2}$ yields:

$$\Delta V'_{BE} = \frac{kT}{q} \cdot \ln\left(\frac{A}{B}\right) - \frac{kT}{q} \cdot \ln\left(\frac{C}{D}\right) + \frac{R_B(T)I_c}{\beta(T)} \cdot (A - B - C + D) \quad \text{(Equation 10)}$$

In the circuit 200, the values of the current multipliers A→D are selected to cancel the temperature-dependent base resistance and β values for $\Delta V_{BE}'$, with:

$$A - B - C + D = 0 \quad \text{(Equation 11)}$$

with the stipulation that none of the currents A→D are equal to one another. In one configuration, the current sources 224, 228, 264, and 268 produce relative current levels of A=5, B=1 (unity current), C=6, and D=2, respectively. For example, when the current B is set at 10 μA, then the current A is 50 μA, the current C is 60 μA, and the current D is 20 μA.

Using the current multipliers that satisfy equation 11, the circuit 200 operates according to the simplified equation expressed as:

$$\Delta V'_{BE} = \frac{kT}{q} \ln\left(\frac{A \cdot D}{B \cdot C}\right) \quad \text{(Equation 12)}$$

Equation 12 can thus be solved for the temperature T of the transistors 208, 216, 248, and 256, resulting in:

$$T = \frac{q \Delta V'_{BE}}{k \ln\left(\frac{A \cdot D}{B \cdot C}\right)} \quad \text{(Equation 13)}$$

Thus, the relationship of the current levels A→D as described above in equation 100 enables the temperature of the transistors in the circuit 200 to be identified without requiring additional information about the base and emitter resistances or β values of the transistors in the circuit 200.

In the configuration of FIG. 2, the combined outputs 232 and 272 are combined simultaneously to produce $\Delta V_{BE}$ or $\Delta V'_{BE}$. The output of the circuit 200 is operatively connected to analog or digital circuits in various embodiments. For example, an analog control system receives the voltage value of $\Delta V_{BE}$ or $\Delta V'_{BE}$ directly.

A digital system identifies the voltage value of $\Delta V_{BE}$ or $\Delta V'_{BE}$ using an analog to digital converter (ADC) to produce a digital representation of the analog voltage differential value. In one digital embodiment, additional processing software produces an output of the temperature T in the absolute temperature scale using the equation 7 or 12 solved for T with the identified value of $\Delta V_{BE}$ or $\Delta V'_{BE}$, respectively, and the predetermined ratios of the currents A→D, the Boltzmann constant k, and the elementary electron charge q. The software is configurable to convert the absolute temperature to scales such as Centigrade or Fahrenheit for display to human operators.

Figure 3:
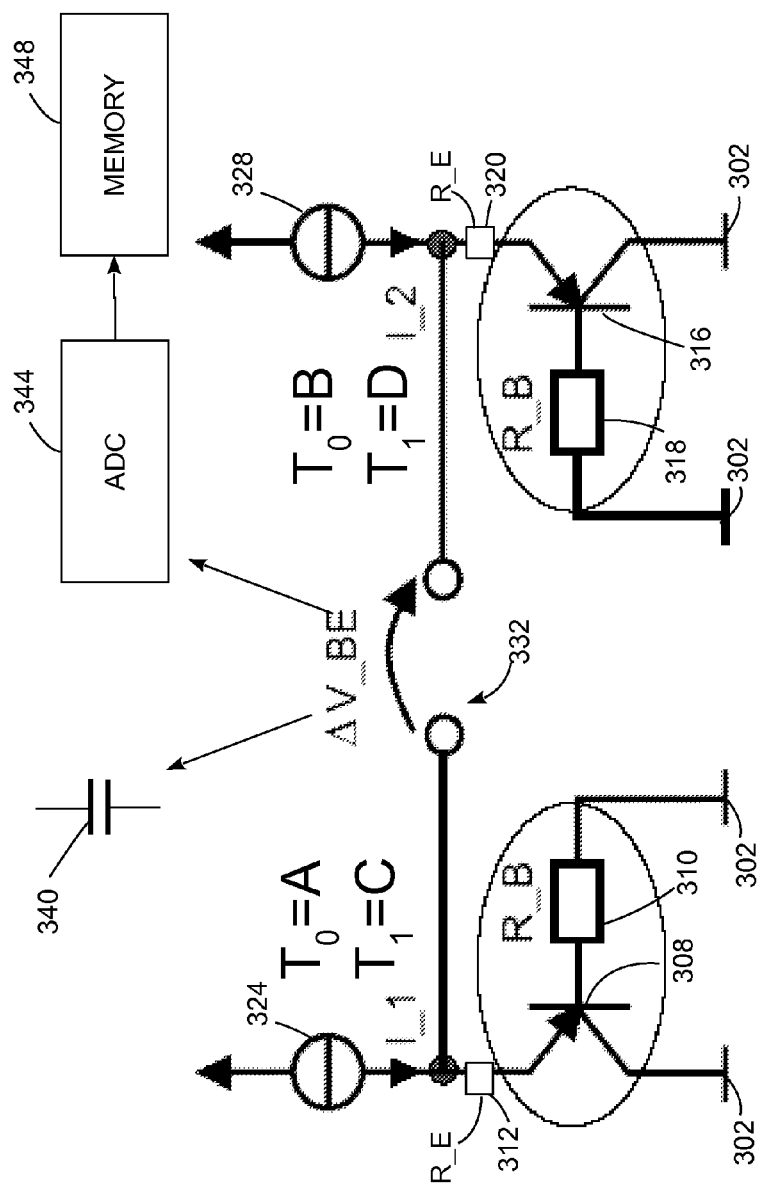
FIG. 3 is a schematic diagram of another embodiment of a temperature sensor circuit that reduces or eliminates errors introduced by the inherent base resistors in the transistors and includes time multiplexing.

FIG. 3 depicts another temperature sensing circuit 300. The circuit 300 has a similar configuration to either one of the sub-circuits 204 and 240 in FIG. 2, but the circuit 300 is configured to use time multiplexing to identify the temperature. The circuit 300 includes a transistor set with two transistors 308 and 316, which have emitters that are electrically connected to current sources 324 and 328, respectively.

In the circuit 300, the inherent base resistances are depicted as resistors 310 and 318 for the transistors 308, and 316, respectively. The base of each of the transistors 308 and 316, is connected in series with ground 302 through the corresponding base resistor.

In the circuit 300, the inherent emitter resistances are depicted as resistors 312 and 320, for the transistors 308, and 316, respectively. The current sources 324 and 328 are connected to the transistors 308 and 316 through the resistors 312 and 320, respectively.

In the circuit 300, the current sources 324 and 328 are both adjustable current sources that produce different levels of electrical current that flow through the transistors 308 and 316, respectively. For example, during a first time period $T_0$ the current sources 324 and 328 produce the current levels A and B that are described above with reference to FIG. 2.

During time period $T_0$, the output 332 produces the voltage differential $\Delta V_{BE1}$. During a second time period $T_1$, the current sources 324 and 328 produce the current levels C and D, respectively, and the output 332 produces the voltage differential of the circuit $\Delta V_{BE2}$. Those having skill in the art will appreciate that the current sources 324 and 328 in the circuit 300 can produce the sets of currents A and B or C and D in any order during operation of the circuit 300.

As described above, $\Delta V_{BE}$ is the sum of $\Delta V_{BE1}$ and $\Delta V_{BE2}$, and $\Delta V'_{BE}$ is the difference between $\Delta V_{BE1}$ and $\Delta V_{BE2}$. Thus, one of the values of $\Delta V_{BE1}$ and $\Delta V_{BE2}$ that is generated at a previous time is stored for use with the present-time output of the circuit 300.

In FIG. 3, a buffer capacitor 340 is charged to the voltage level of the previous output of either $\Delta V_{BE1}$ or $\Delta V_{BE2}$ and the sum of or difference between the voltage in the capacitor 340 and the present time output 332 of the circuit 330 is used to identify $\Delta V_{BE}$ or $\Delta V'_{BE}$, respectively. The buffer capacitor 340 can be incorporated with additional analog output circuitry for use with the circuit 300.

In another configuration depicted in FIG. 3, the previous output of either $\Delta V_{BE1}$ or $\Delta V_{BE2}$ is supplied to an analog to digital converter (ADC) 344 and a digital representation of the previous output voltage differential is stored in a digital memory 348, such as a static or dynamic random access memory (RAM). The ADC 344 also generates a digital representation of the present-time output 332 of the circuit 300, and additional digital logic identifies the value of $\Delta V_{BE}$ or $\Delta V'_{BE}$.

The circuit 300 operates in a similar manner to the circuit 200, but the circuit 300 uses a time multiplexed configuration. The circuit 300 includes two transistors and two adjustable current sources instead of the four transistors and four current sources of the circuit 200.

Figure 4:
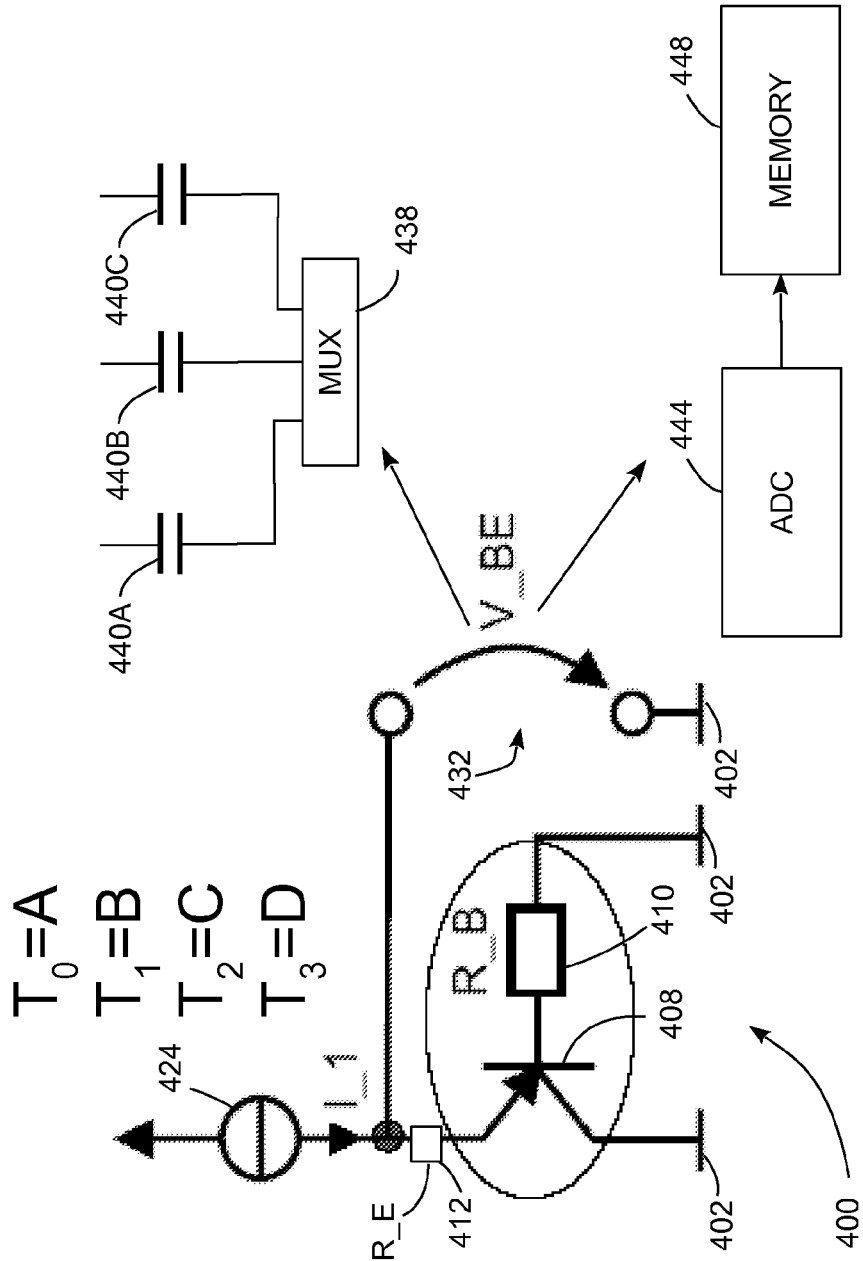
FIG. 4 is a schematic diagram of another embodiment of a temperature sensor circuit that reduces or eliminates errors introduced by the inherent base resistor in a single transistor and includes time multiplexing.

FIG. 4 depicts another temperature sensing circuit 400. The circuit 400 also uses time multiplexing as described above with reference to FIG. 3, but uses a single transistor and current source to provide the four currents A→D during four distinct time periods instead of the two time periods of FIG. 3.

The circuit 400 includes a transistor set with a single transistor 408, which has an emitter that is electrically connected to current source 424. The transistor 408 includes an inherent base resistor 410 and inherent emitter resistor 412. The base of the transistor 408 is connected in series with ground 402 through the base resistor 410. The current source 424 is connected to the emitter of the transistor 408 through the emitter resistor 412.

In the circuit 400, the current source 424 is an adjustable current source that produces different levels of electrical current that flow through the transistor 408. For example, the current source 424 produces the four current levels A, B, C, and D, discussed above with reference to FIG. 2 during four different time periods $T_0$, $T_1$, $T_2$, and $T_3$. Those having skill in the art will appreciate that the current source 424 can produce the currents A→D in any order during operation of the circuit 400.

During each of the time periods $T_0$→$T_4$, the circuit 400 outputs a single base-emitter voltage potential. The base-emitter voltage from the output 432 charges one of three capacitors 440A, 440B, and 440C that are selected with a multiplexer 438 during each time period. In another embodiment, a single capacitor stores a total charge from the previous three time periods and a switch reverses the sign of the base-emitter voltage in the circuit 400 to enable addition or subtraction of voltage in the single transistor. In a digital embodiment, an ADC 444 converts the base-emitter voltage into digital data for storage in the memory 448 during each time period.

During operation, the stored values from the previous time periods are combined with the present output 432 of the circuit 400 to identify $\Delta V_{BE}$ or $\Delta V'_{BE}$. The circuit 400 operates in a similar manner to the circuit 300, but the circuit 400 uses a single current source and single transistor with time multiplexing to identify the $\Delta V_{BE}$ or the $\Delta V'_{BE}$ that is associated with the temperature of the transistor 408.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A circuit comprising:
   at least one transistor comprising:
   a first transistor and a second transistor, each of the first transistor and the second transistor having a base, a collector, and an emitter;
   at least one current source being configured to apply four different currents (A, B, C, and D) to the emitter of the at least one transistor, the at least one current source being configured to produce the four different currents with either:
   a sum of the current A and the current C being substantially equivalent to a sum of the current B and the current D; or
   a sum of the current A and the current D being substantially equivalent to a sum of the current B and the current C; and
   the circuit being configured to output:
   a first voltage potential between the emitter of the at least one transistor and the base during application of the current A to the emitter of the at least one transistor;
   a second voltage potential between the emitter of the at least one transistor and the base during application of the current B to the emitter of the at least one transistor;
   a third voltage potential between the emitter of the at least one transistor and the base during application of the current C to the emitter of the at least one transistor;
   a fourth voltage potential between the emitter of the at least one transistor and the base during application of the current D to the emitter of the at least one transistor; and
   the first transistor and the second transistor being configured to:
   output a first voltage differential corresponding to a difference between the first voltage when current A is applied to the emitter of the first transistor at a first time and the second voltage when current B is applied to the emitter of the second transistor at the first time; and
   output a second voltage differential corresponding to a difference between the third voltage when current C is applied to the emitter of the first transistor at a second time and the fourth voltage when current D is applied to the emitter of the second transistor at the second time.

2. The circuit of claim 1 wherein a temperature of the at least one transistor corresponds to a voltage sum of a difference of the second voltage potential subtracted from the first voltage potential and a difference of the fourth voltage potential subtracted from the third voltage potential.

3. The circuit of claim 2 wherein the temperature of the at least one transistor further corresponds to the voltage sum multiplied by an elementary charge of an electron and divided by a product of the Boltzmann constant and a natural logarithm of a quotient of the current A multiplied by the current C divided by the current B multiplied by the current D.

4. The circuit of claim 1 wherein a temperature of the at least one transistor corresponds to a voltage sum of a difference of the second voltage potential subtracted from the first voltage potential and a difference of the third voltage potential subtracted from the fourth voltage potential.

5. The circuit of claim 4 wherein the temperature of the at least one transistor further corresponds to the voltage sum multiplied by an elementary charge of an electron and divided by a product of the Boltzmann constant and a natural logarithm of a quotient of the current A multiplied by the current D divided by the current B multiplied by the current C.

6. The circuit of claim 1, at least one of the first transistor and the second transistor being a bipolar transistor.

7. The circuit of claim 1, at least one of the first transistor and the second transistor being a complementary metal oxide (CMOS) transistor that is configured to operate in a bipolar mode.

8. A circuit comprising:
   a parasitic resistance system including a first parasitic resistance device, a second parasitic resistance device, a third parasitic resistance device, and a fourth parasitic resistance device, each of the first, second, third, and fourth parasitic resistance devices including a base, a collector, and an emitter; and
   at least one current source configured to apply four different currents (A, B, C, and D) to the emitters of the first parasitic resistance device, second parasitic resistance device, third parasitic resistance device, and fourth parasitic resistance device in the parasitic resistance system to generate an emitter-base voltage potential in each of the first parasitic resistance device, second parasitic resistance device, third parasitic resistance device, and fourth parasitic resistance devices, wherein either (i) a sum of the current A and the current C is substantially equivalent to a sum of the current B and the current D, or (ii) a sum of the current A and the current D is substantially equivalent to a sum of the current B and the current C, and wherein the circuit is configured to (i) generate a first emitter-base voltage potential during application of the current A from the at least one current source to the emitter of the first parasitic resistance device, (ii) generate a second emitter-base voltage potential during application of the current B from the at least one current source to the emitter of the second parasitic resistance device, (iii) generate a third emitter-base voltage potential during application of the current C from the at least one current source to the emitter of the third parasitic resistance device, (iv) generate a fourth emitter-base voltage potential during application of the current D from the at least one current source to the emitter of the third parasitic resistance device, and (v) generate an output associated with a temperature of the parasitic resistance system based upon the first emitter-base voltage potential, the second emitter-base voltage potential, the third emitter-base voltage potential, and the fourth emitter-base voltage potential.

9. The circuit of claim 8 wherein the temperature of the parasitic resistance system corresponds to a voltage sum of a difference of the second voltage potential subtracted from the first voltage potential and a difference of the fourth voltage potential subtracted from the third voltage potential.

10. The circuit of claim 9 wherein the temperature of the parasitic resistance system further corresponds to the voltage sum multiplied by an elementary charge of an electron and divided by a product of the Boltzmann constant and a natural logarithm of a quotient of the current A multiplied by the current C divided by the current B multiplied by the current D.

11. The circuit of claim 8 wherein the temperature of the parasitic resistance system corresponds to a voltage sum of a difference of the second voltage potential subtracted from the first voltage potential and a difference of the third voltage potential subtracted from the fourth voltage potential.

12. The circuit of claim 11 wherein the temperature of the parasitic resistance system further corresponds to the voltage sum multiplied by an elementary charge of an electron and divided by a product of the Boltzmann constant and a natural logarithm of a quotient of the current A multiplied by the current D divided by the current B multiplied by the current C.

13. The circuit of claim 8, at least one of the first parasitic resistance device, second parasitic resistance device, third parasitic resistance device, and fourth parasitic resistance device in the parasitic resistance system being a bipolar transistor.

14. The circuit of claim 8, at least one of the of the first parasitic resistance device second parasitic resistance device third parasitic resistance device, and fourth parasitic resistance device in the parasitic resistance system being a complementary metal oxide (CMOS) transistor that is configured to operate in a bipolar mode.

* * * * *